United States Patent
Sachs et al.

(10) Patent No.: US 8,072,180 B1
(45) Date of Patent: Dec. 6, 2011

(54) SYNCHRONOUS SAMPLING OF PWM WAVEFORMS

(75) Inventors: Jason M. Sachs, Goffstown, NH (US); John David Heinzmann, Manchester, NH (US)

(73) Assignee: DEKA Products Limited Partnership, Manchester, NH (US)

( * ) Notice: Subject to any disclaimer, the term of this patent is extended or adjusted under 35 U.S.C. 154(b) by 2216 days.

(21) Appl. No.: 10/308,887

(22) Filed: Dec. 3, 2002

(51) Int. Cl.
*H02P 27/04* (2006.01)
*H02P 25/00* (2006.01)

(52) U.S. Cl. .................. 318/807; 318/810; 318/811

(58) Field of Classification Search .............. 318/807, 318/810, 811, 599; 363/40, 41
See application file for complete search history.

(56) References Cited

U.S. PATENT DOCUMENTS

| | | | | |
|---|---|---|---|---|
| 3,766,497 A * | 10/1973 | Opal et al. | ...................... | 327/116 |
| 4,212,074 A * | 7/1980 | Kuno et al. | ...................... | 702/173 |
| 4,337,438 A * | 6/1982 | Guggenbuhl et al. | ........... | 330/10 |
| 4,504,777 A * | 3/1985 | Bauer | ............................ | 323/300 |
| 4,947,723 A * | 8/1990 | Kawashima et al. | ........... | 84/603 |
| 5,355,136 A * | 10/1994 | Katagiri | ........................ | 341/157 |
| 5,392,042 A * | 2/1995 | Pellon | ............................ | 341/143 |
| 5,619,114 A | 4/1997 | Blasko | ............................ | 318/812 |
| 5,706,186 A * | 1/1998 | Blasko | ............................ | 363/41 |
| 6,456,946 B1 * | 9/2002 | O'Gorman | ....................... | 702/58 |
| 6,788,792 B1 * | 9/2004 | Maejima et al. | ................ | 381/106 |
| 6,813,124 B1 * | 11/2004 | Pierson | .......................... | 361/35 |
| 6,873,142 B2 * | 3/2005 | Pierson | .......................... | 323/299 |
| 6,963,194 B2 * | 11/2005 | Wu | ............................. | 324/76.11 |
| 7,193,388 B1 * | 3/2007 | Skinner et al. | ................ | 318/811 |
| 2004/0113671 A1 * | 6/2004 | Anderson et al. | ............. | 327/172 |

FOREIGN PATENT DOCUMENTS

| | | | | |
|---|---|---|---|---|
| JP | 61135375 | A | * | 6/1986 |
| JP | 04140064 | A | * | 5/1992 |
| JP | 10210757 | A | * | 8/1998 |

OTHER PUBLICATIONS

Blasko, Vladimir "Sampling of Discontinuous Voltage and Current Signals in Electrical Drives: A System Approach," *IEEE Transactions on Industry Applications*, vol. 34, No. 5, pp. 1123-1130 Sep./Oct. 1998.

* cited by examiner

*Primary Examiner* — Eduardo Colon Santana
(74) *Attorney, Agent, or Firm* — McCormick, Paulding & Huber LLP

(57) ABSTRACT

A device for filtering a carrier frequency of a PWM waveform. The device includes a low-pass filter for converting the PWM waveform into an analog signal. The device further includes a sampling analog-to-digital converter receiving the analog signal from the low-pass filter and the device also includes a controller for causing the non-integrating analog to digital converter to sample the PWM waveform at the pulse frequency rate thereby rejecting the carrier frequency. As already stated the PWM waveform includes a pulse which has a leading edge, a top portion, and a trailing edge. In one embodiment, the controller causes the A/D converter to sample during the top of the pulse. Preferably, the controller causes the A/D converter to sample at substantially the center of the pulse.

43 Claims, 18 Drawing Sheets

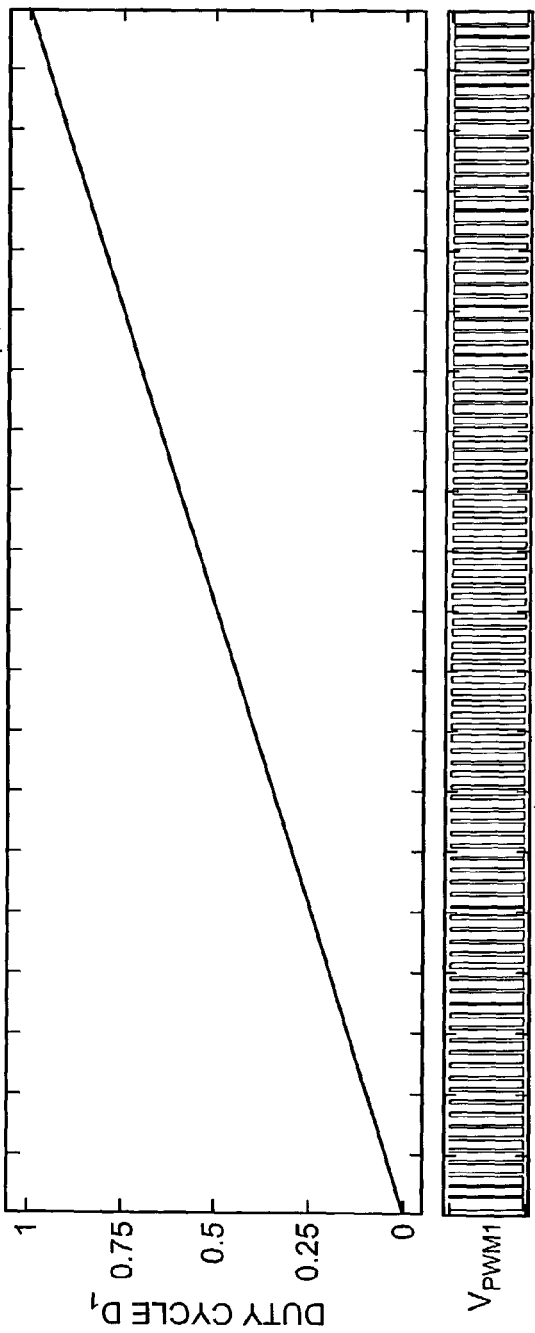
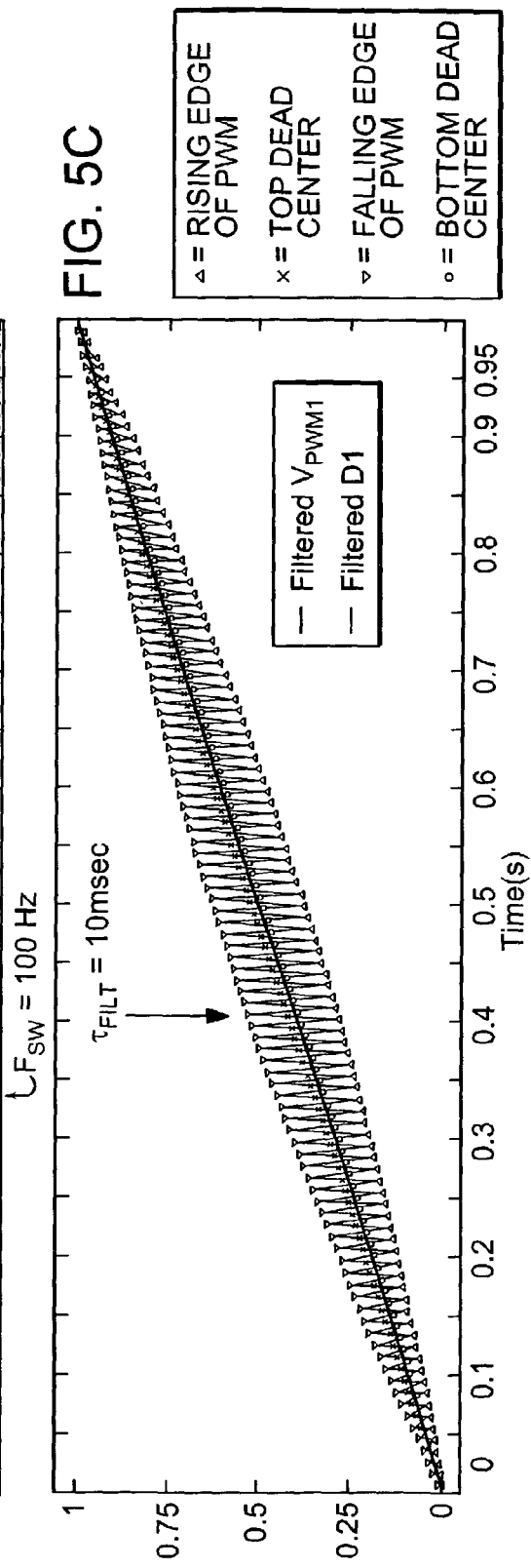
FIG. 5A
FIG. 5B
FIG. 5C

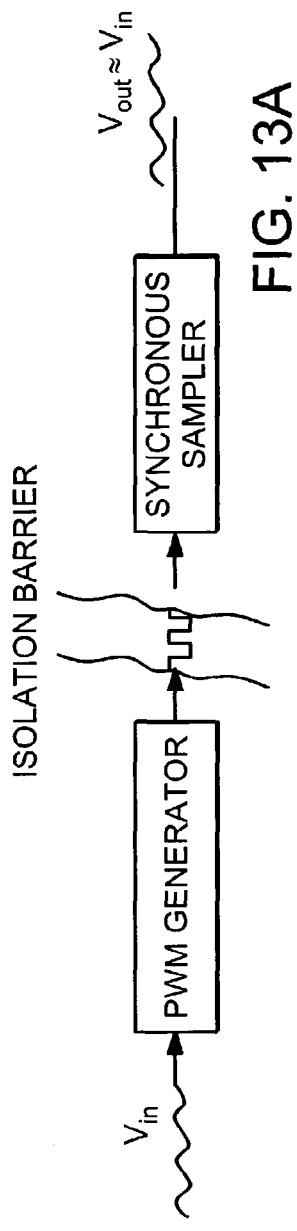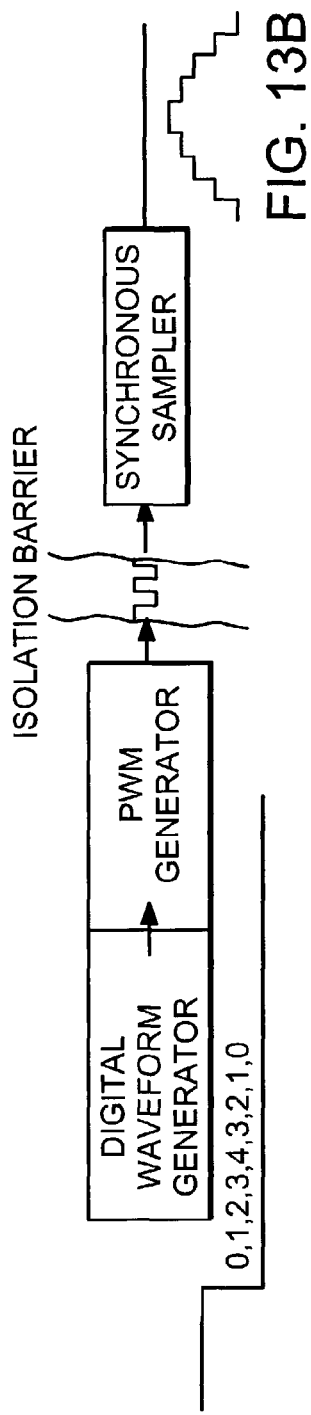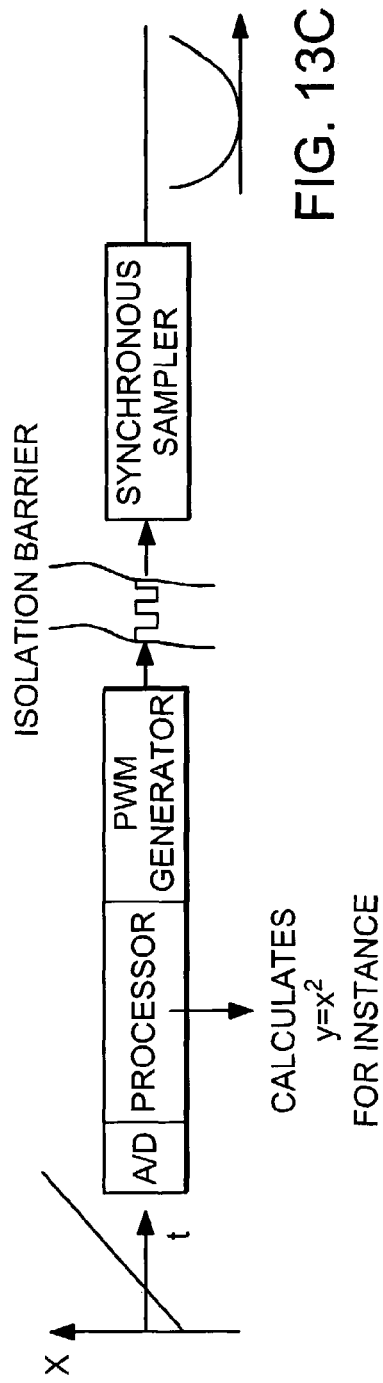

SYNCHRONOUS SAMPLING OF PWM WAVEFORMS

TECHNICAL FIELD AND BACKGROUND ART

The present invention relates to pulse width modulation and more specifically to filtering pulse width modulated waveforms.

In many cases it is not feasible to impose a DC or low-frequency waveform directly on a given system. Instead a pulse width modulated (PWM) waveform may be produced and then averaged using a low-pass filter.

It is known in the prior art to use a PWM waveform for producing a high-frequency waveform of a desired average. The analog representation can be recovered by demodulating/filtering the waveform. However, as the bandwidth content of the average waveform approaches the carrier frequency, the requirements of the recovery filter become stricter. The filter must reject the carrier frequency while passing through the desired signal. One means to design such a filter is to create a high order low pass linear time invariant filter. One drawback of such a design is phase lag. The higher the order of the filter, the more accurate the filter is, but the greater the phase lag that is introduced which is undesirable in a feedback control system.

Another approach to retrieving the analog version of the PWM waveform is to integrate the PWM waveform over one PWM period and to calculate the average value over one cycle. An embodiment of such a circuit is shown in FIG. 1 as taken from U.S. Pat. No. 5,619,114. Such a circuit requires an integrator, amplifier, and a calibration scheme to account for component tolerance. Thus, there is a need for a simpler system and method for obtaining the analog representation of a PWM waveform, when frequency content of this analog representation is significant when compared to the PWM frequency.

SUMMARY OF THE INVENTION

One embodiment of the invention is a device for filtering a carrier frequency of a PWM waveform. The PWM waveform has one or more pulses wherein each pulse is created at a pulse frequency rate. Such a device may be used to measure an actual load voltage and used as in input signal in a frequency control loop. For example, a load may be for a motor, such as a motor that is used in a self-balancing personal vehicle. The voltage is converted to a torque, which allows the motor of the personal vehicle to turn the wheels. A predetermined voltage is expected to occur at the motor, however due to real-world factors, the actual voltage is not equal to the predetermined value at the load. The actual voltage is then used as the input to the frequency control loop/speed control loop for the self-balancing personal vehicle.

The device includes a low-pass filter for converting the PWM waveform into an analog signal. The device further includes a sampling analog-to-digital to converter receiving the analog signal from the low-pass filter and the device also includes a controller for causing the non-integrating analog to digital converter to sample the PWM waveform at the pulse frequency rate thereby rejecting the carrier frequency. As already stated the PWM waveform includes a pulse which has a leading edge, a top portion, and a trailing edge. In one embodiment, the controller causes the A/D converter to sample during the top of the pulse.

Preferably, the controller causes the A/D converter to sample at substantially the center of the pulse. In another embodiment, the controller causes the A/D converter to sample at the bottom of the pulse and preferably at the center of the bottom of the pulse. It should be understood that the bottom of the pulse is the time during which the pulse of the PWM waveform is low, however due to filtering the signal is not equal to zero. Sampling should occur during each pulse frequency period. In a further embodiment, the controller causes the A/D converter to sample substantially at the top center of the pulse and at the bottom of the pulse and then the sampled values are averaged together. In this embodiment, sampling occurs at least twice during the pulse frequency period.

In one embodiment, the low pass filter is a simple first order RC circuit. In another embodiment, the low pass filter is a second order filter which has only one major pole. In other embodiments, the low pass filter may be second order or greater. In such embodiments in which the filter is second order or greater, more must be done to compensate for the phase lag that is caused by higher order filters. One solution is sampling after the center of the pulse.

The PWM waveform in one embodiment is single ended and in other embodiments the PWM waveform may be a differential signal.

In certain embodiments the controller that is used for signaling the sampling analog-to-digital converter to sample may also be used to create the PWM waveform. In some embodiments the controller does not have timing information for causing the analog to digital converter to sample and thus an edge detector is included. The edge detector senses one or more edges of the filtered PWM waveform (analog signal). The sensing of the edge can be used for signaling the analog to digital converter to sample. In other embodiments the values of the signal at the leading and the trailing edge of the pulse are averaged to provide the sampling value.

The device may further include a compensation function module that receives the output of the digital to analog converter and compensates for known errors.

In one embodiment, a voltage source produces a bus voltage. The PWM waveform is fed to one or more switches that open and close according to the duty cycle of the PWM waveform. When the switch is closed the bus voltage is occurs across the load. This voltage is also presented to the low pass filter. In another embodiment, there is a plurality of loads and a plurality of switches. In such an embodiment a differential signal between the two loads is provided to a differential filter prior to providing a filtered version of the differential signal to the analog to digital converter.

BRIEF DESCRIPTION OF THE DRAWINGS

The foregoing features of the invention will be more readily understood by reference to the following detailed description, taken with reference to the accompanying drawings, in which:

FIG. 5A shows a graph of the desired duty cycle over time;

FIG. 5B shows a graph of a pulse width modulated representation of the duty cycle of FIG. 5A;

FIG. 5C shows the filtered and sampled PWM waveform wherein sampling has to been taken at different points during the pulse;

FIGS. 13A-C are three variations of systems in which the originating signal is shown to be in either an analog or a digital form prior to transmission across an isolation barrier.

DETAILED DESCRIPTION OF SPECIFIC EMBODIMENTS

Figure 1:
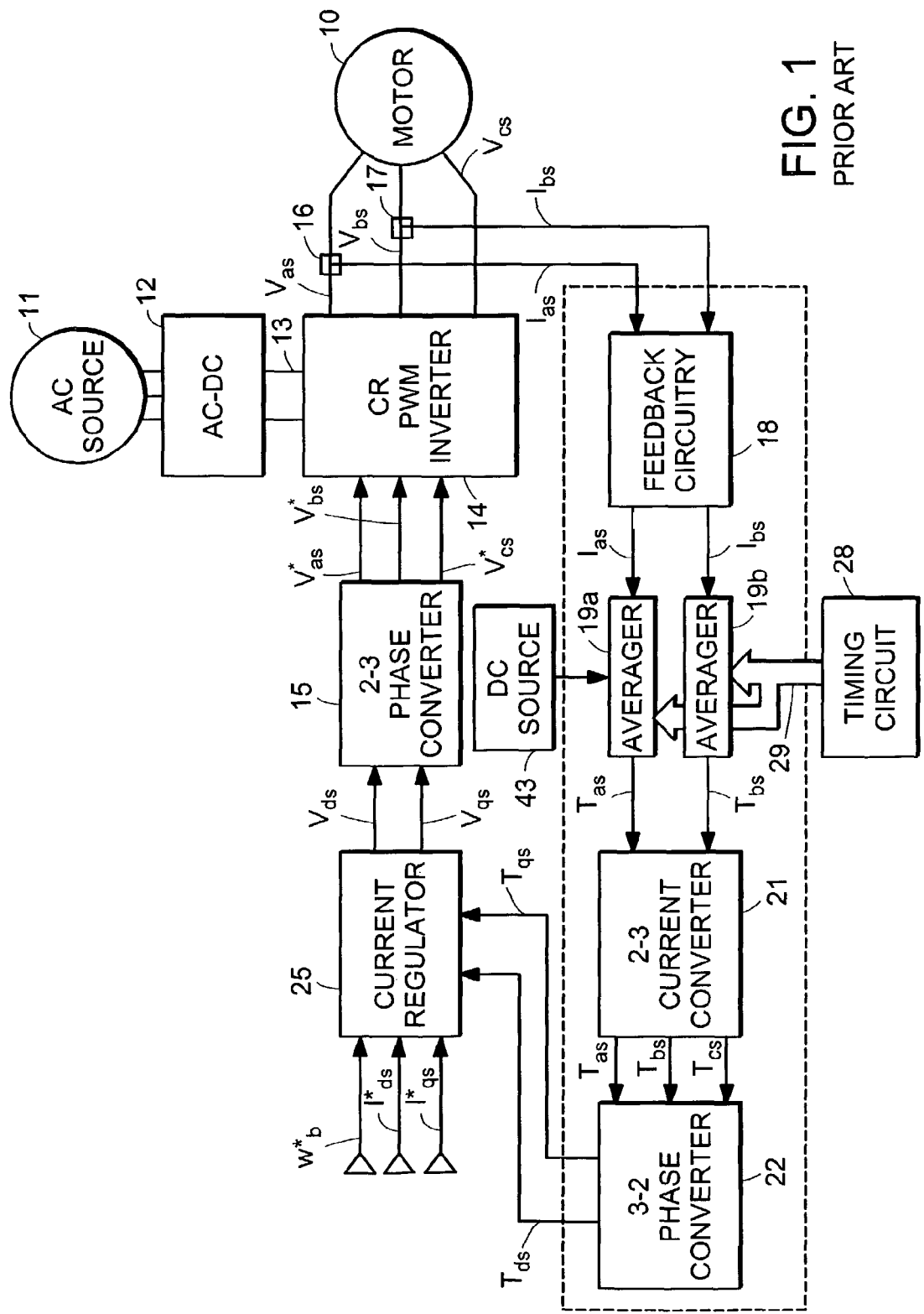
FIG. 1 is a schematic of a prior art system for filtering a PWM waveform, wherein the system includes an integrator.
Figure 2:
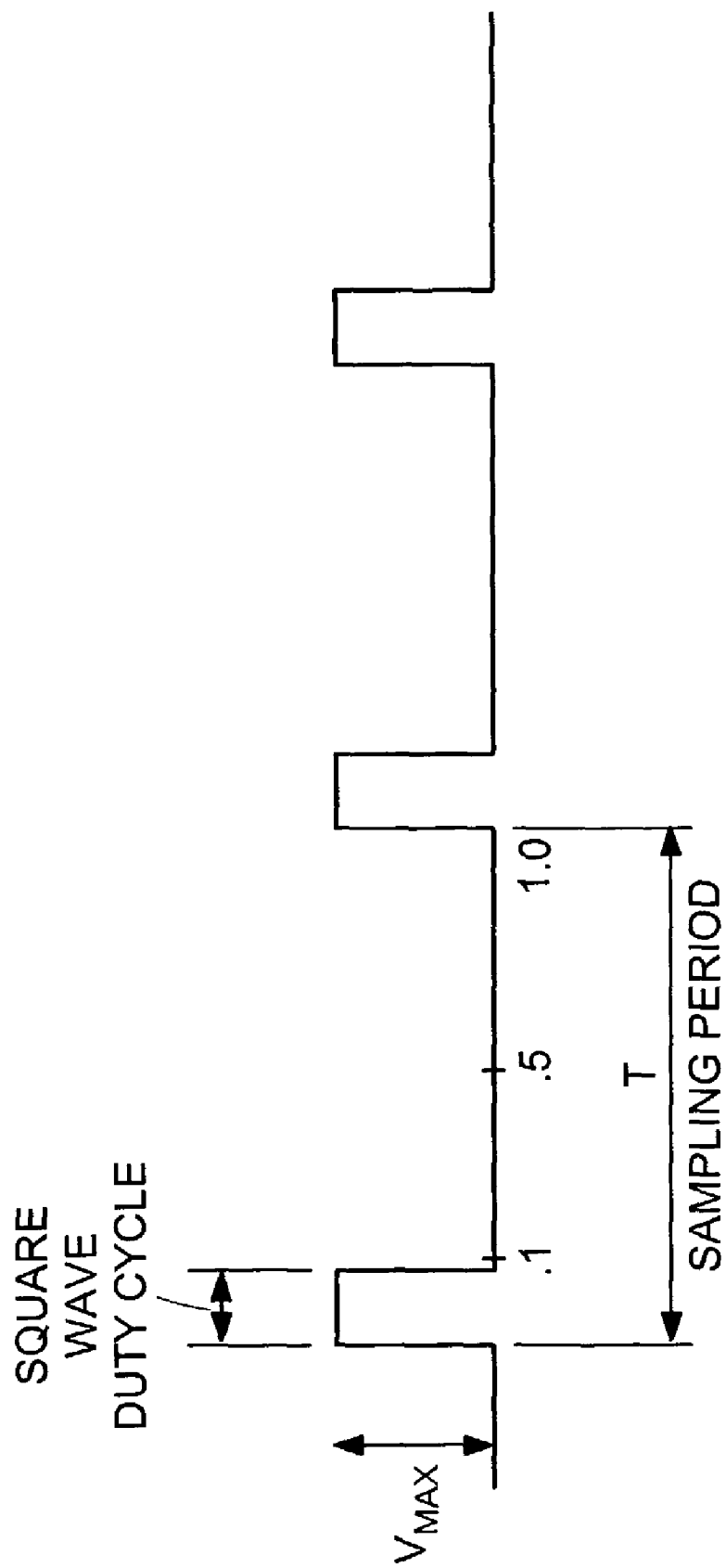
FIG. 2 is sample of a PWM waveform showing the switching period.

Definitions. As used in this description and the accompanying claims, the following terms shall have the meanings indicated, unless the context otherwise requires: a "pulse-width modulated waveform" is a digital representation of an analog signal. The "duty cycle" is the fraction of time for which a pulse waveform is at an "on" level. The remainder of the time, the waveform is at an "off" level. The "switching period" is the period of the PWM waveform. For example, FIG. 2 shows a sampling period in which the value that is created is 10% of the input voltage (Vbus). During the sampling period the signal is on for 1/10 of the period. Thus, the duty cycle of the pulse is 1/10. This waveform produces an average output voltage that is 10% of the voltage of Vbus.

Figure 3:
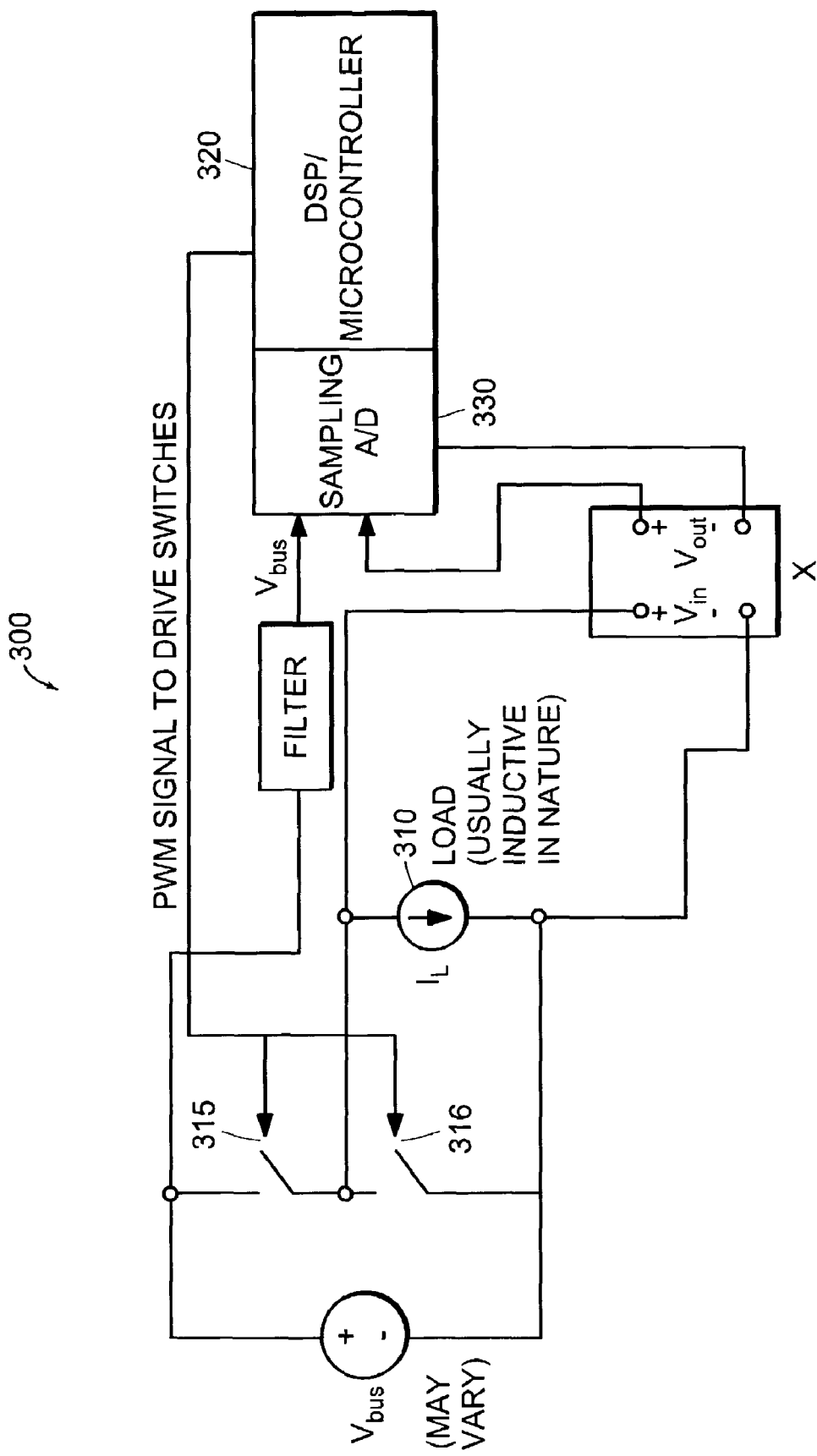
FIG. 3 is a filter design for filtering a PWM waveform by synchronously resampling the signal.

FIG. 3 is a circuit 300 for filtering a PWM waveform by synchronously resampling the signal. Synchronous resampling is used in order to capture the actual average voltage of the PWM waveform. In FIG. 3, an intended average voltage is being applied across a load 310. For example, the load 310 may be an inductive load such as a motor. The intended average voltage is equal to D*Vbus (where D is the intended duty cycle). In order to cause the switches 315, 316 to be turned on and off at a rate to create the duty cycle, a PWM waveform from a micro-controller 320 is fed to control the switches 315, 316.

Because the actual average voltage across the inductive load may be different from the intended average voltage due to non-linearities in a power circuit, for instance a proper measurement of the actual average voltage may be necessary for feedback control. The actual average voltage may be different than the intended voltage for several reasons, such as voltage drops across the switches/diodes, faults in the circuit such as an open or short circuit etc. Synchronous sampling is thus used to obtain the actual average voltage across the load. The voltage that is presented to the inductive load is also presented at Vin. This input voltage is filtered through a simple one pole low pass filter which may be an RC circuit. The filtered signal is then passed into a sampling analog-to-digital converter 330 that samples at the same sampling rate as that which was used to create the PWM waveform. The sampled signal Vp is equal to the actual average voltage (Vpwm) plus an error E*(Vbus). This system is useful if E is small. This sampled voltage Vp can then be fed to a feedback control loop that adjusts the PWM waveform to compensate for any nonlinearities in the power circuitry. This compensation may be used in an open-loop or closed-loop manner, as appropriate for a particular application.

In order to retrieve the duty cycle from the Vout signal the sampling A/D converter is provided with Vbus as an input. Since the average voltage <Vpwm>=D*(Vbus), and since the sampled signal Vp=<Vpwm>+E*(Vbus), Vbus may be divided out to get D'=Vp/Vbus=D+E.

In one embodiment such a system may be used in a human transporter to control the voltage signal that is used to power motors for a wheeled vehicle, such as, a human transporter as made by Segway company LLC as shown in U.S. Pat. No. 6,288,505 which is incorporated herein by reference in its entirety.

In an embodiment as shown in FIG. 3 the switches 315, 316 are both N-MOS transistors that close when the PWM control signal is high. In other embodiments, the switches 315, 316 may have one active and one passive element. For example, switch I may be a diode while switch 2 is an active element such as a MOS transistor. Thus, when the PWM waveform is high, a voltage signal is provided to the A/D converter 330. The A/D converter then receives the filtered signal and samples at the same frequency as the switching frequency. This synchronous sampling causes the carrier frequency of the PWM waveform to be removed. The carrier frequency for the PWM waveform is the sampling period of the signal.

Figure 4:
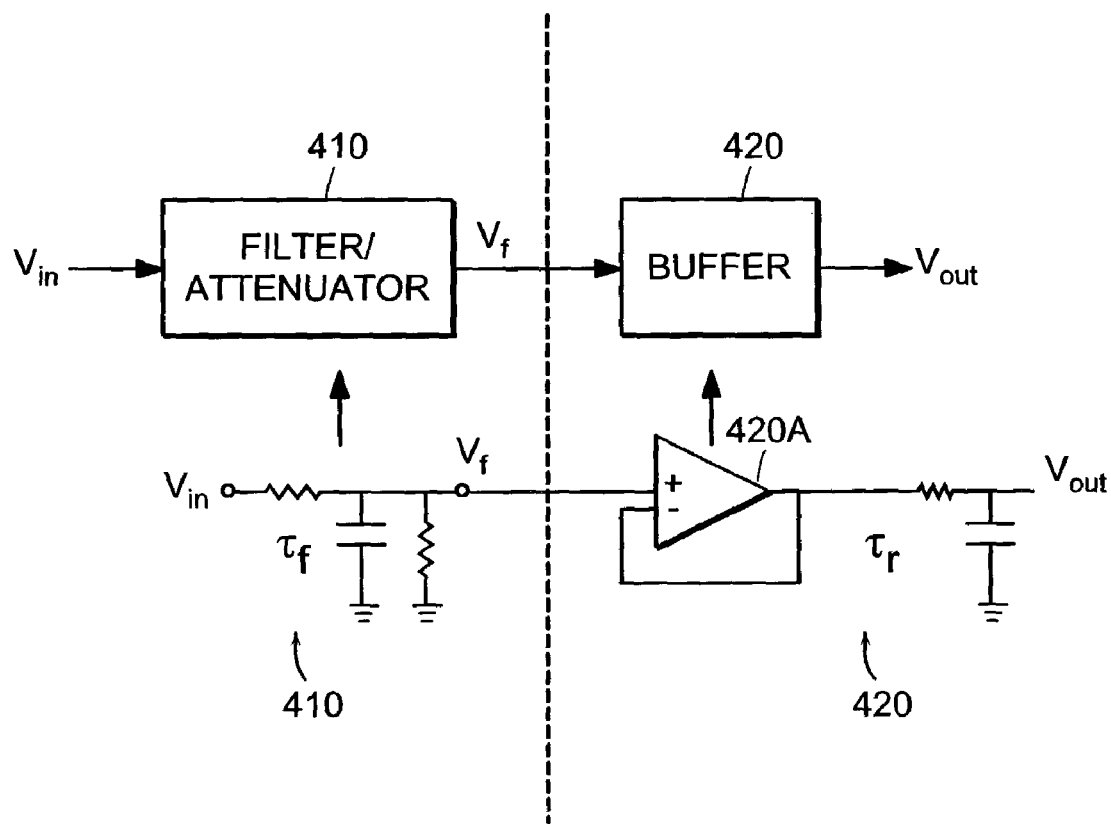
FIG. 4 is one example of the filter and buffer of block X of FIG. 3.

In the embodiment shown in FIG. 3 Switch 315 and 316 are controlled by a control signal from a DSP or microcontroller 320. The DSP/Microcontroller outputs a PWM control signal to the switches. Switch 315 closes when the PWM control signal is on, while switch 316 is closed when the PWM control signal is off. This creates a voltage across the inductive load 310 with substantially the same duty cycle as the PWM control signal. The voltage across the load Vpwm is passed into block X. Block X is shown in FIG. 4 which shows the voltage Vin being passed to a filter 410 which attenuates the signal. The filter may be a simple low-pass RC circuit as shown wherein such a filter has a single pole and time constant $\tau_f$. A buffer may follow the filter although the buffer is not a necessary element. The buffer may be used for holding Vout until the A/D converter is ready to sample. As shown in FIG. 4, the buffer is an operational amplifier 420A with unity feedback. The RC filter takes the pulse and smoothes each voltage pulse creating an average value during a sampling period. After the buffer, a further filter may be provided with time constant $\tau_r$. Preferably, the first filter should have the dominant pole such that $\tau_f$ should be much greater than $\tau_r$. From the filter, the analog signal is passed to the sampling A/D converter. The sampling A/D converter samples at the same rate that was used to create the PWM waveforms. The sampling instant preferably occurs at the top or bottom center of the duty cycle pulse during the sampling period as will be explained.

Figure 4A:
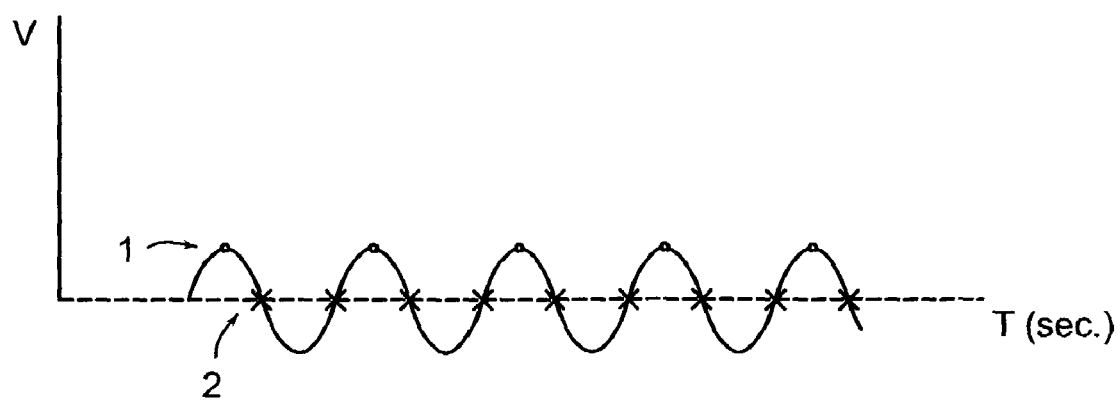
FIG. 4A shows a sine wave that is synchronously sampled at the PWM frequency.

This synchronous sampling at the carrier frequency causes the carrier to be aliased to DC. An important component is the timing of the sampling is to minimize this aliased DC component. For example, FIG. 4A shows a sine wave that is synchronously sampled at the PWM frequency; however the timing of the samples at point 1 causes a DC offset whereas there is no DC offset that results from the sampling at point 2.

Figure 5:
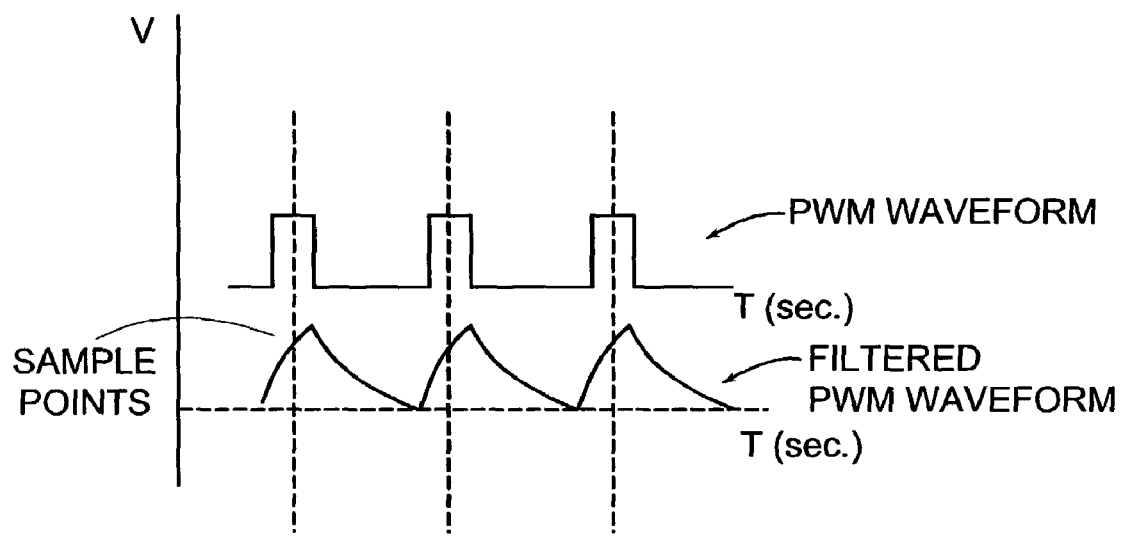
FIG. 5 shows sampling occurring at the center of the pulse.
Figure 6:
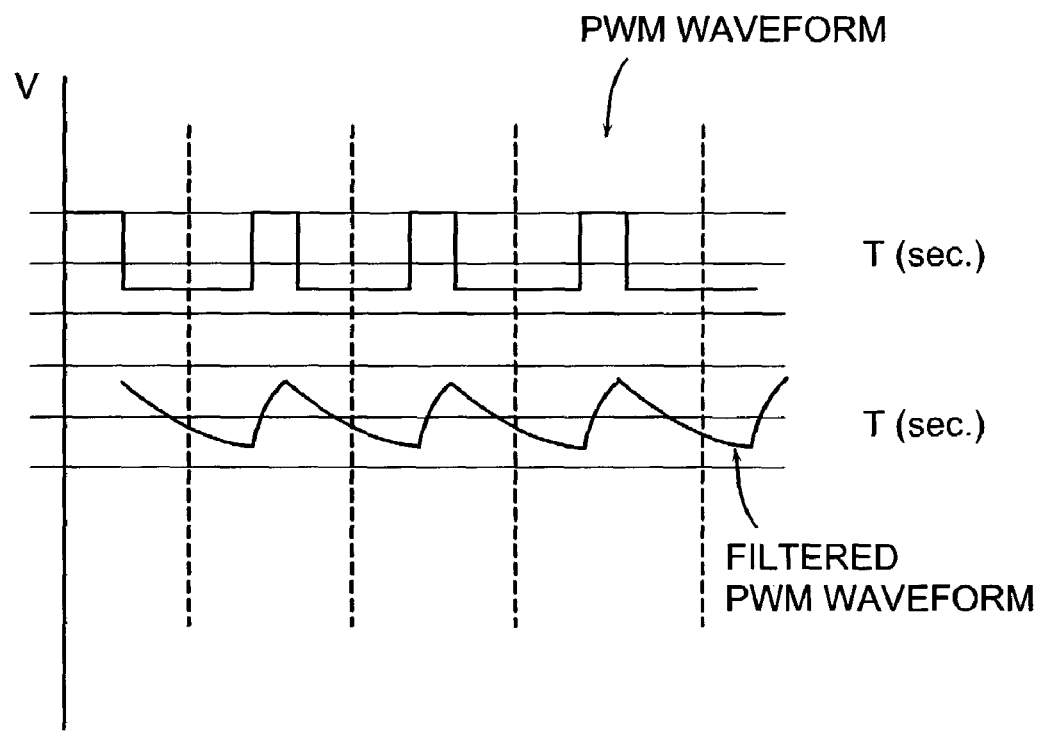
FIG. 6 shows sampling at the bottom of a pulse.
Figure 7:
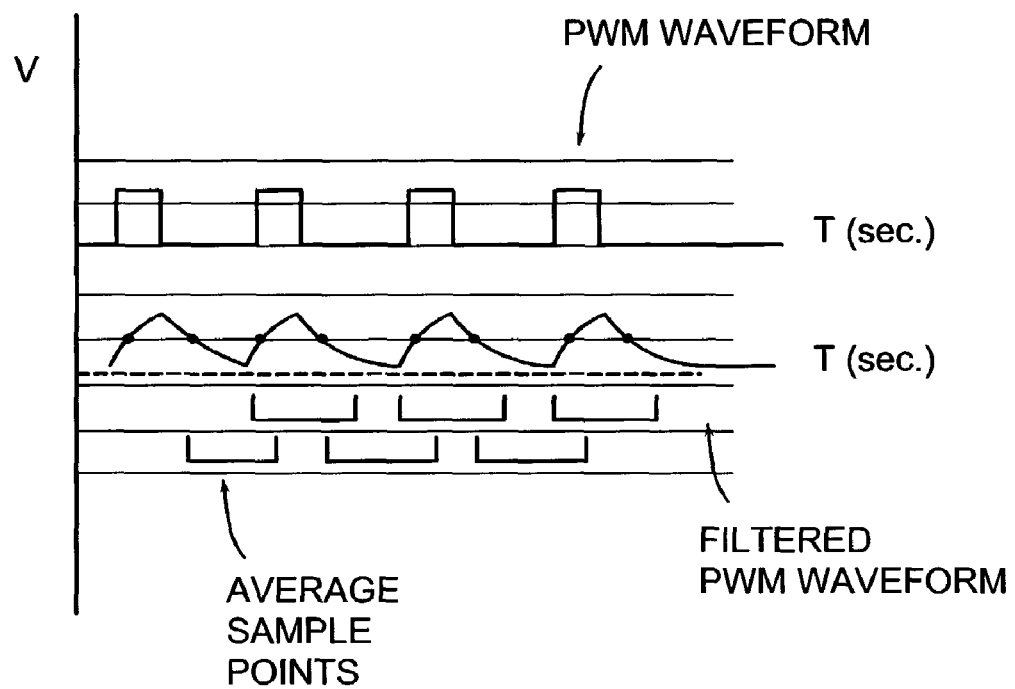
FIG. 7 shows the sampling values from FIG. 5 and FIG. 6 being averaged together.

In a first embodiment, the sample is taken at the center of the pulse by the A/D converter as shown in FIG. 5. Sampling the PWM pulse after it has been filtered, at the center of the PWM pulse, is one way of minimizing the offset from the carrier waveform. Such sampling can be at the top or at the bottom of the pulse. FIG. 6 shows the sample taken at the center of the bottom of the PWM pulse. In a third variation, as shown in FIG. 7 the samples at the center of the pulse in FIG. 5 and the center of the pulse in FIG. 6 are averaged together. Such an embodiment requires that the sampling rate is twice that of the sampling period.

FIGS. 5A-C are three graphs. The first graph FIG. 5A shows the desired duty cycle over time. The second graph FIG. 5B is the PWM representation of the duty cycle over time. In this Fig. the PWM waveform is increasing in duty cycle over multiple sampling periods from near 0 at the left side of the graph, to near 1 at the right side of the graph. FIG. 5C shows the filtered PWM waveform wherein sampling has been taken at different points during the pulse. The triangular shaped markers represent sampling at the rising edge and the falling edge of the PWM waveform. As can be seen from the graph these are the points that are farthest away from the filtered duty cycle signal. The PWM waveform is shown also filtered at the top center of the pulse (designated by an x) and at the bottom center of the pulse (designated by a dot). When sampled at the top and at the bottom center of the pulse, the signal more accurately represents the duty cycle. When the sampling is done at the top and bottom centers of the pulse a saw tooth is formed wherein the errors are nearly equal and opposite.

The output from the A/D converter is then compared to the expected average voltage and an error signal can be determined. The error signal is passed back to a feedback control loop that adjusts the PWM waveform that is produced by the microcontroller. An example of such a feedback system is disclosed in U.S. Pat. No. 6,288,505 which is incorporated herein by reference in its entirety.

It should be noted that the RC time constant $\tau_f$ works preferably well if it is approximately between 0.1 and 5 T where T is the PWM period. It should also be noted that when the RC time constant is less than 0.1 T the time constant is too short and excessive ripple occurs and when the time constant is greater than 5T there is extensive phase lag.

With the first three methods as described above (sampling at the center top, sampling at the center bottom and averaging the center top and the center bottom), a first order RC filter is preferred because the carrier attenuation is $2^{nd}$ order such that the harmonics are attenuated at 40 dB/decade due to the proper phase relationship between the harmonic component and the sampling waveform. More specifically, when a harmonic component of the carrier waveform at frequency $f_h$ passes through such a first-order filter, its amplitude is multiplied by a gain factor $$|H(f_h)| = \frac{1}{\sqrt{(2\pi f_h RC)^2 + 1}}.$$

Figures 1, 6A:
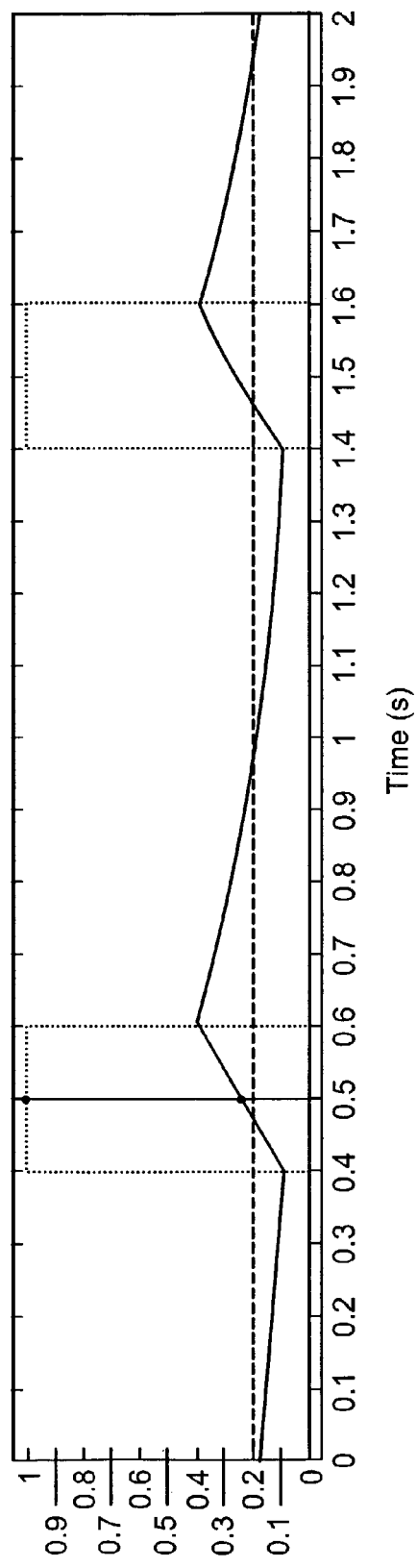
FIG. 6A shows the signal attenuation of the pulse harmonics before and after filtering.
Figures 2, 6A:
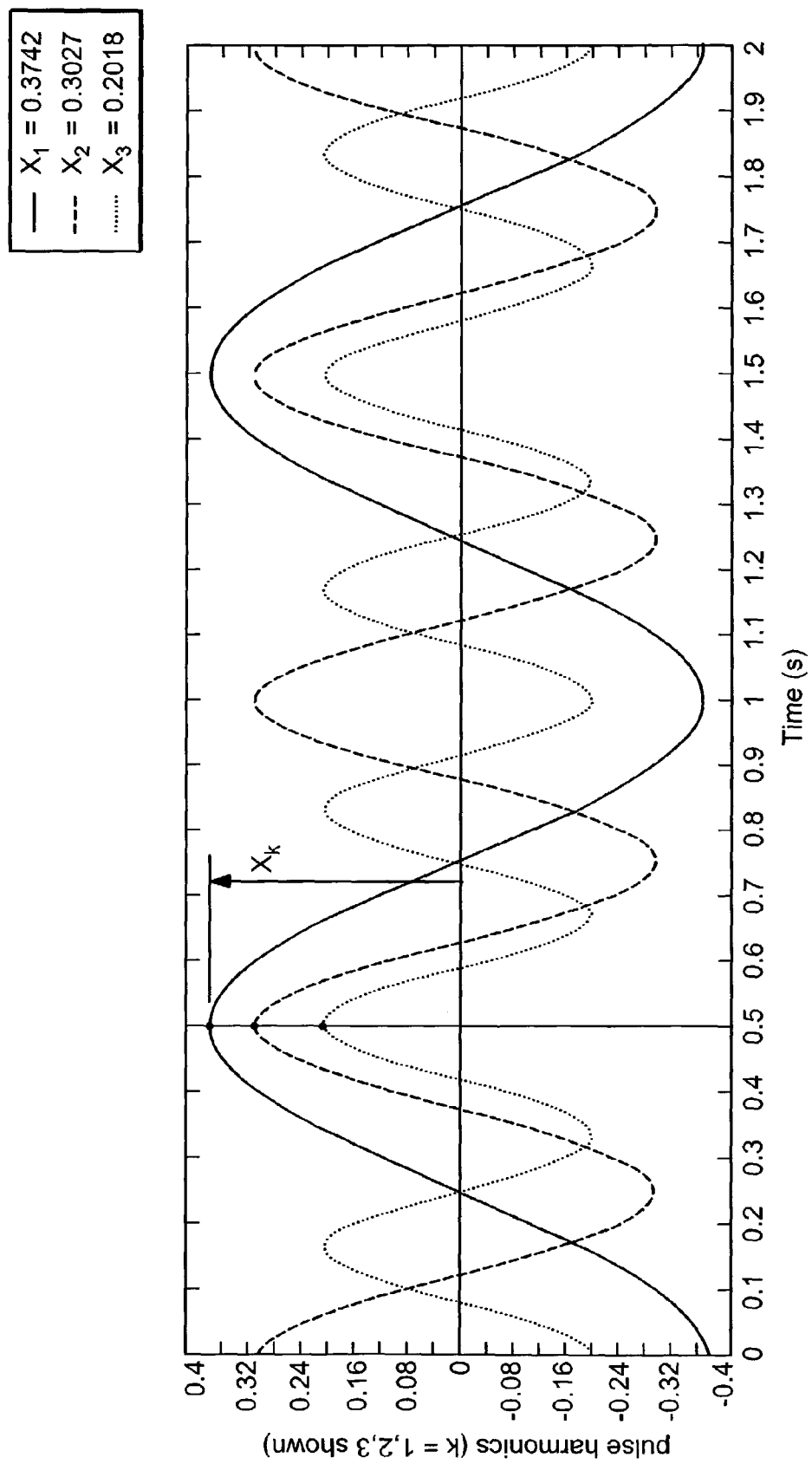
Figures 3, 6A:
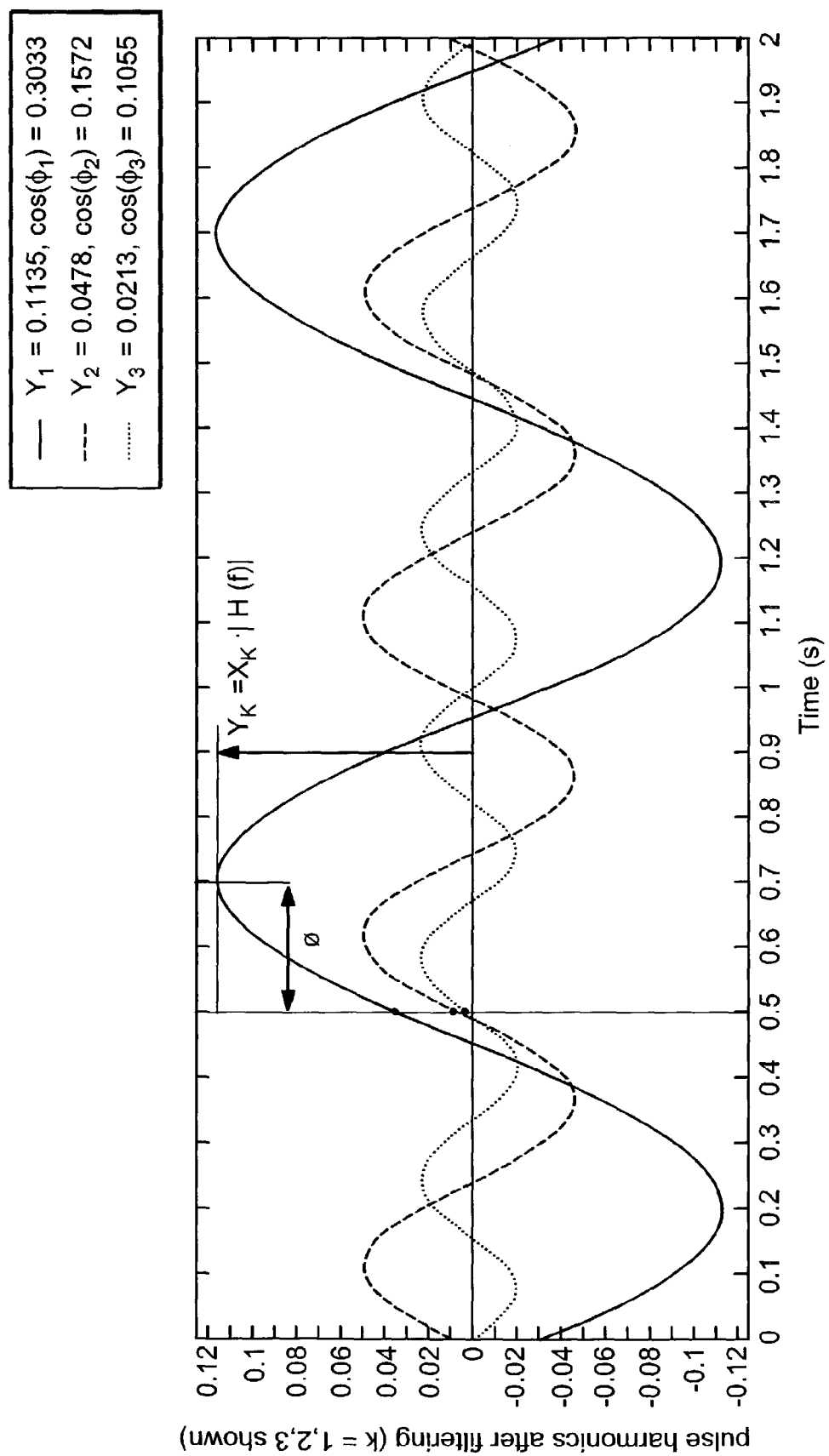

Once the harmonic frequency $f_h$ exceed the cutoff frequency $$F_c = \frac{1}{2\pi RC},$$

this gain $|H(f_h)|$ rolls off at 20 dB/decade. Prior to the filter, harmonics of a pulse waveform have a peak which is exactly in phase with the top center of the pulse. After the filter, these harmonics see a phase lag $\phi = -\angle H(f_h) = \tan^{-1} 2\pi f_h RC$ which begins to approach 90 degrees as $f_h$ exceeds $f_c$. The component of these harmonics, when sampled exactly at the top center of the pulse, is reduced further by a gain of $$\cos\phi = \frac{1}{\sqrt{(2\pi f_h RC)^2 + 1}}$$

which rolls off at 20 dB/decade. (These effects are illustrated in FIG. 6A.) Thus there is attenuation in the amplitude of the harmonics at 20 dB/decade, and an additional attenuation of 20 dB/decade caused by the phase relationship between carrier harmonic and sampling instant. If a $2^{nd}$ order filter is used this phase relationship is disrupted (unless the timing of the sampling instant is adjusted) and there is less carrier attenuation for the same attenuation for the signal of interest.

Figure 7A:
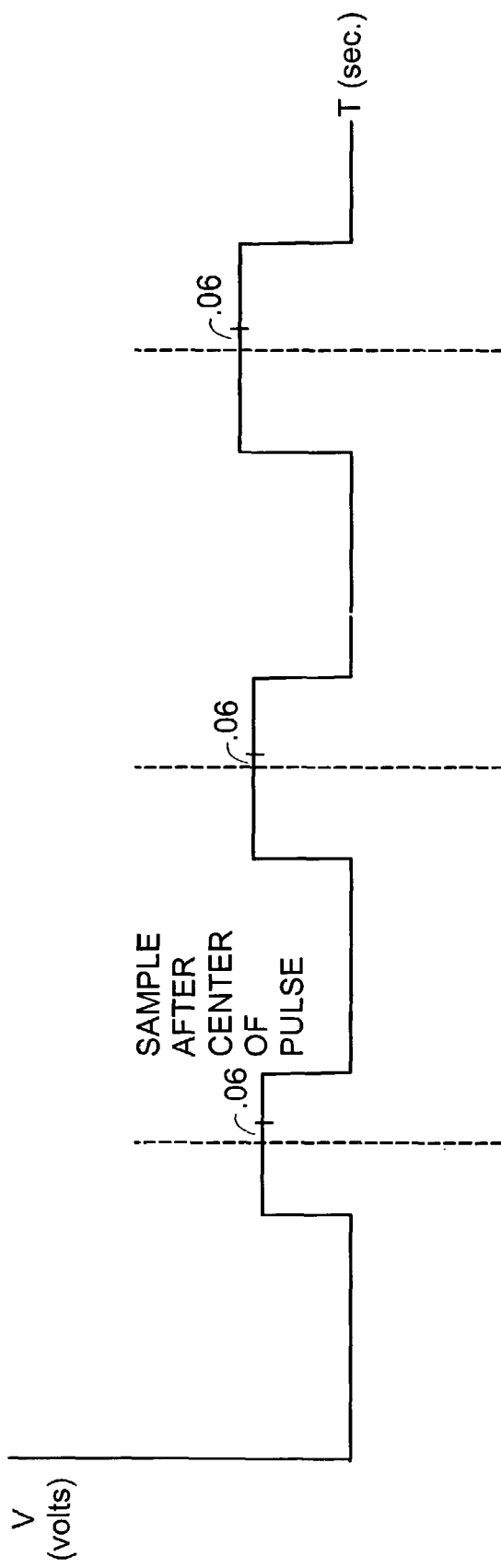
FIG. 7A is a graph showing the sampling occurring after the center of the pulse.

Systems that cannot avoid $2^{nd}$-order and higher poles can still be used as long as they occur at a much higher frequency than the dominant $1^{st}$-order pole. In another embodiment where a higher order filter is used, the effect of the higher order poles can be compensated for by sampling later than the middle of the PWM waveform to reduce the effect of the amplification of the higher order harmonics. For example if $\tau_r = 0.1\tau_f$ where $\tau_f = 1.00T$ sampling could be chosen to be at, for example, 0.06T later than the center of the pulse as shown in FIG. 7A. If the secondary poles are known, a sampling time can be added to compensate. An improvement occurs since the sampling time delay cancels out the time delay due to phase lag. Sampling at a delay adds in an angle that is proportional to the frequency providing a phase shift such that the harmonics are closer to 90 degrees as is the case with a first order RC filter.

Figure 8A:
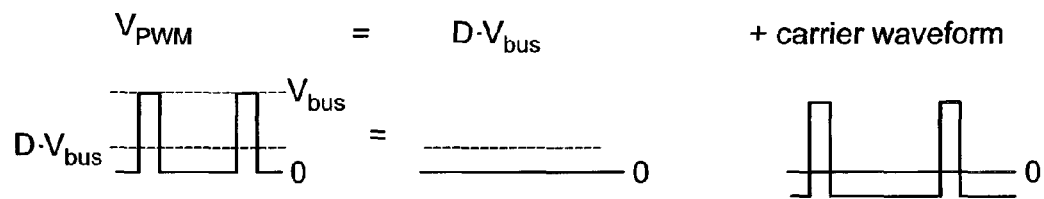
FIGS. 8A-C are graphs that illustrate the repeatable error that is shown in FIG. 8.
Figure 8B:
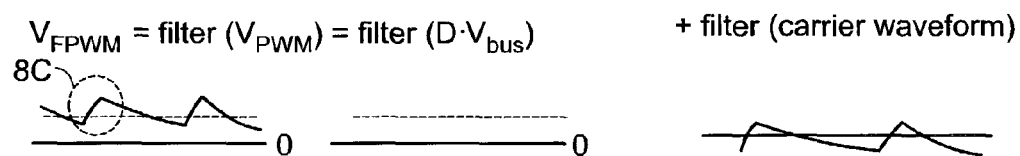
Figure 8C:
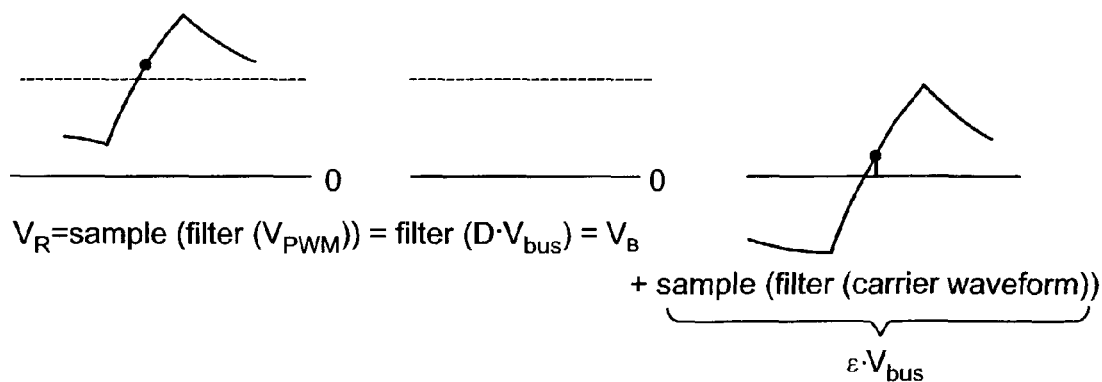
Figure 8D:
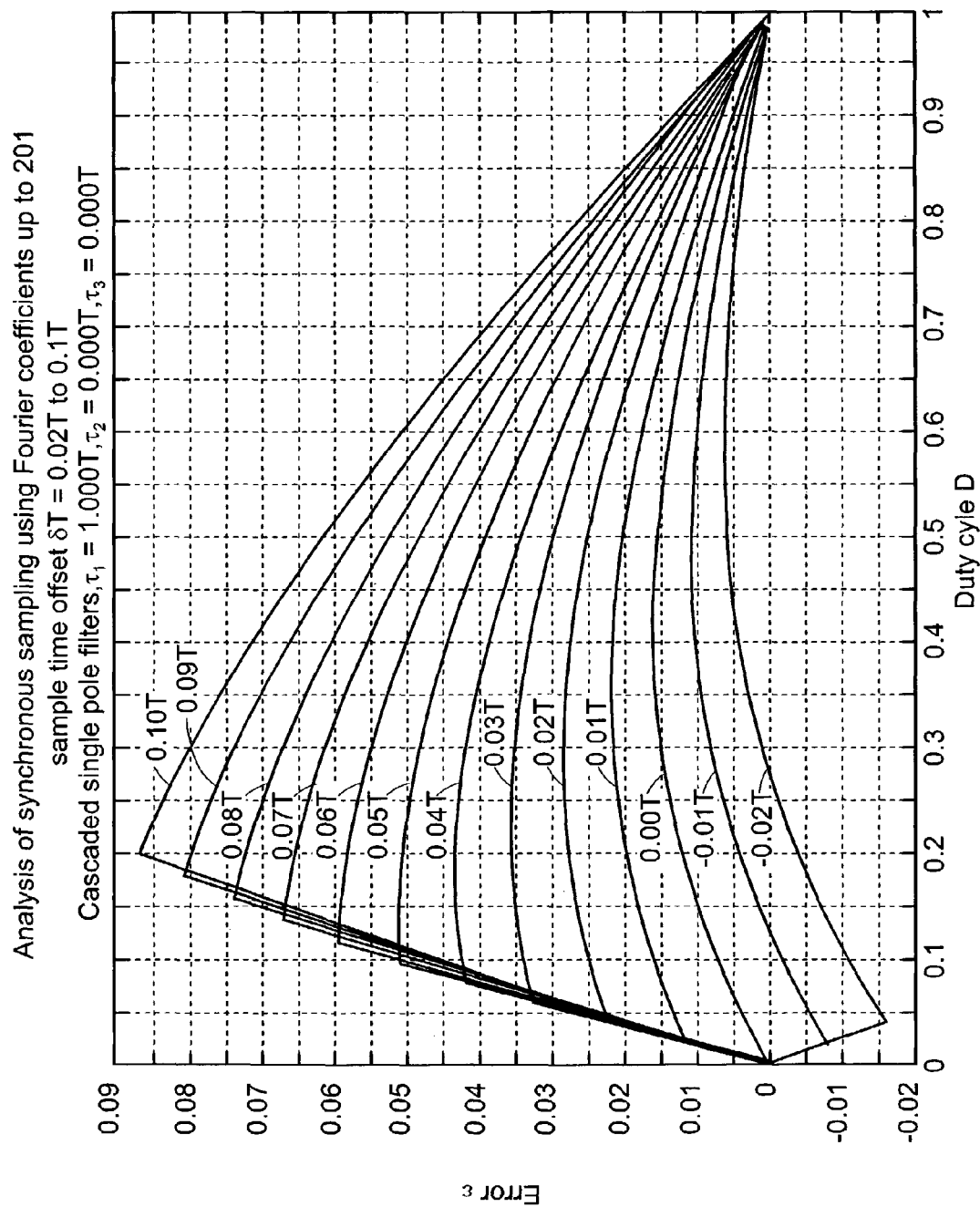
FIG. 8D shows a sample chart of an error function.

In another embodiment, the system may be adapted for repeatable errors, thus making the filter more accurate. FIG. 8A is a diagram that shows Vpwm=D*(Vbus)+carrier waveform. In FIG. 8B, the graphs show the filtered version of FIG. 8A such that Vfpwm=filter(Vpwm)=filter(D*(Vbus))+filer (carrier waveform). FIG. 8C shows the sampled version of FIG. 8B such that Vp=sample(Vfpwm)=filter(D*(Vbus))+ sample(filter(carrier waveform)) wherein the last term is the error e*(Vbus). The error e is only a function of the duty cycle D, the sampling time relative to the center of the PWM waveform and the filter transfer function $H_f(s)$. such that $e=f(H_f(s), D, \delta t)$. Since the filter transfer function is typically fixed as is the sampling time offset $\delta t$, the error varies simply as a matter of the duty cycle D. This is shown in the example of FIG. 8D. The measured duty cycle D'=D+e=D+f(D)=$f_2$(D). The repeatable error e=f(D) can be compensated for by determining the function $f_2$ and inverting it to obtain a function $g_2$ such that D=$g_2$(D')=D'−g(D'). Through experimentation and analysis, an estimate of this error g(D')=g($V_p/V_b$) can be subtracted out to reduce the error that results from this approach wherein Vb is the filtered and sampled bus voltage.

Figure 9A:
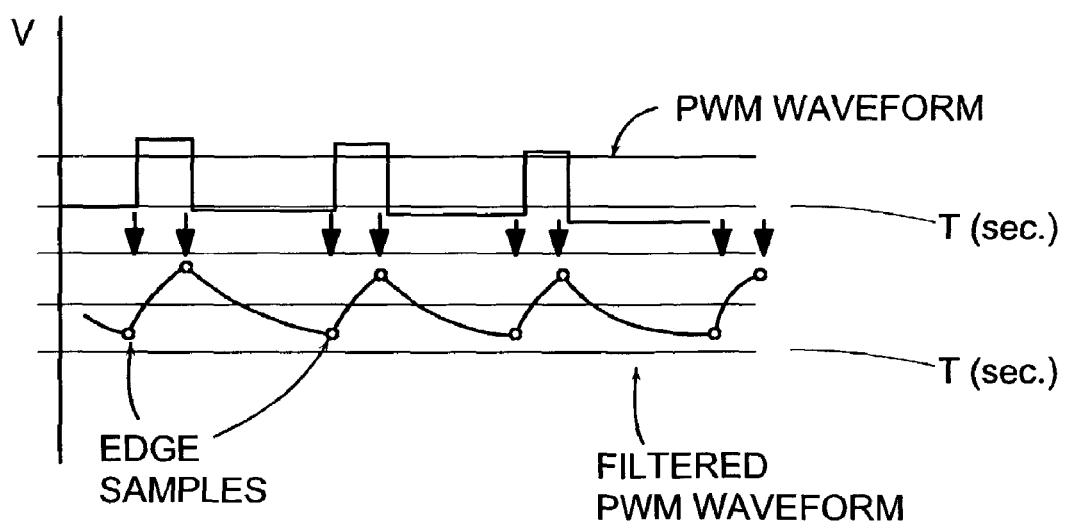
FIG. 9A represents the pulse edges determined by the edge detector of FIG. 9 being used to determine an average value for the pulse.
Figure 9:
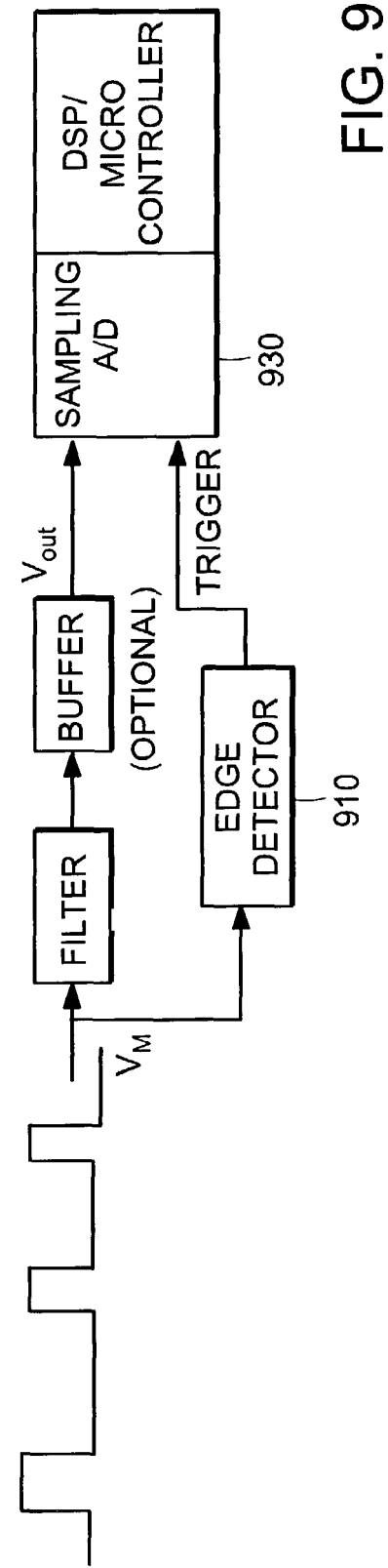
FIG. 9 adds an edge detector to one embodiment of the system.

In yet another embodiment, in which the timing of the original signal is not known, such that the center of each pulse is not identified, an edge detector may be added to the system of FIG. 3 as shown in FIG. 9. The edge detector 910 detects the edges of the digital signal as shown in FIG. 9A. Each edge is used as a trigger for the sampling of the A/D converter 930. Successive pairs of samples are averaged and used as the output Vp. This type of arrangement should be adequate for $\tau_f > T/3$ to $T/2$. Not shown in this figure is a voltage line which passes the Vbus signal to the A/D converter. As before, the Vbus signal is divided out from the input PWM waveform by the A/D converter so that the duty cycle is the output digital signal of the A/D converter.

Figure 10:
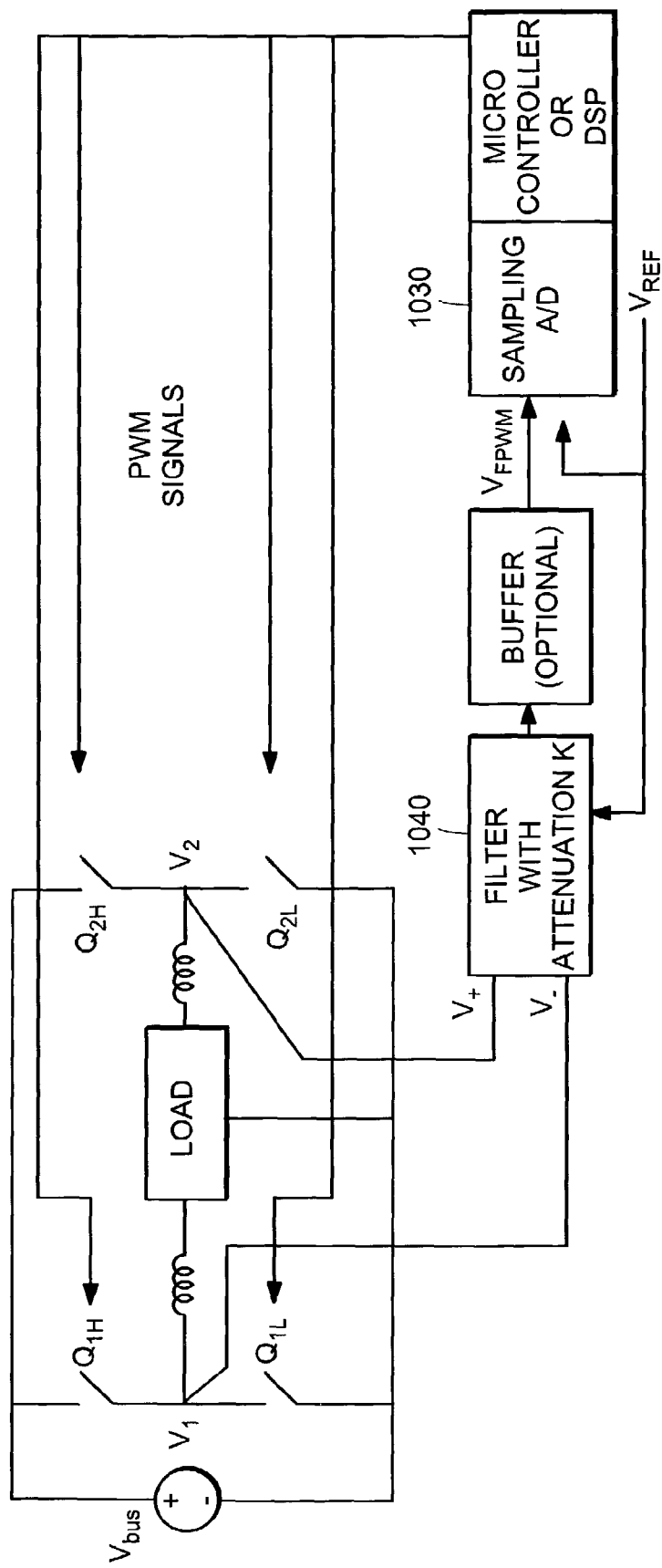
FIG. 10 is a differential version of the device.
Figure 10A:
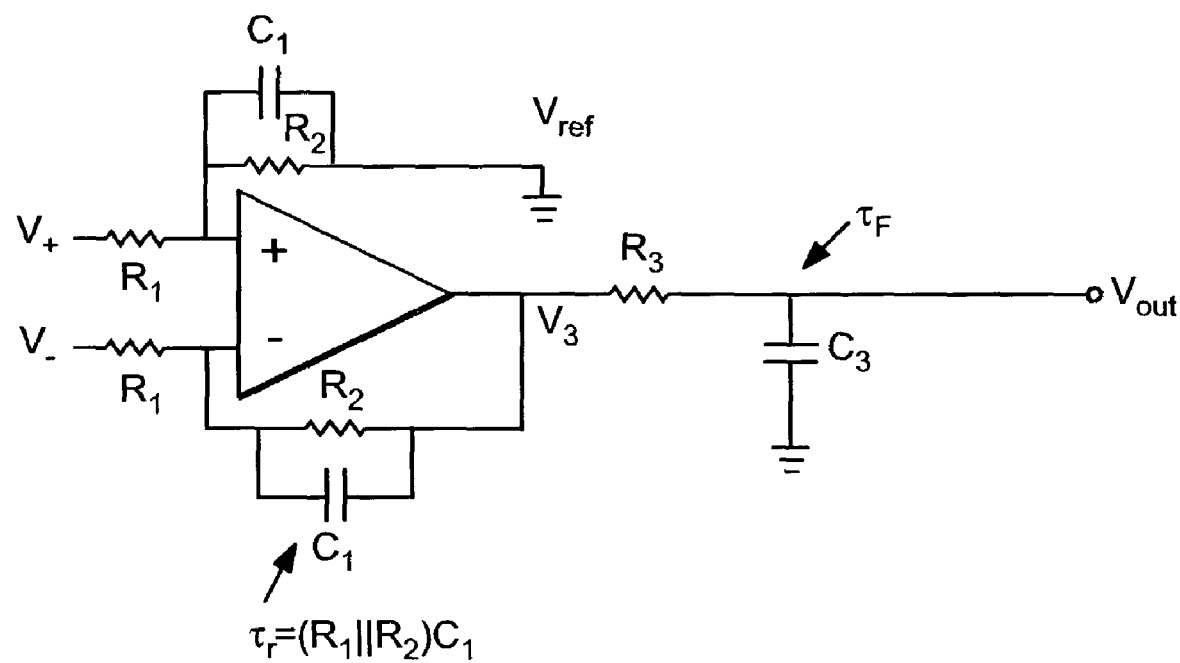
FIG. 10A is one embodiment of the filter for the differential version of FIG. 10.

In another variation the technique can be applied to a differential input as shown in FIG. 10. In this embodiment V1 and V2 can be terminals of a motor, for example, and Vbus provides the regulating voltage such that the voltage across V+ and V− is some percentage of Vbus. Similar to the embodiment shown in FIG. 3, the micro-controller produces a PWM waveform that is used to control the opening and closing of switches Q1H, Q1L, Q2H, and Q2L. In this embodiment, the PWM waveforms of both legs are created with the same carrier frequency. The differential voltage signal is passed to the filter wherein the differential voltage signal (V2−V1) is passed to a differential filter, and through an optional buffer, so that the voltage at the A/D is equal to K*LPF(V2−V1)+Vref. A reference voltage Vref may be added so that a single-ended A/D converter can sample differential voltages of either polarity. The A/D converter 1030 then synchronously samples Vout from the filter at the same rate as the PWM were sampled/created. In such a fashion, the signal is synchronously sampled and the carrier wave is removed wherein the carrier wave is the digital modulation. A filter 1040 for such a differential embodiment is shown in FIG. 10A which is one example of a low-pass differential filter. In this filter design $\tau_f \gg \tau_r$ so that there is a dominant pole defined by a single RC combination ($R_3 C_3$). In this filter design $\tau_r = R_1 \| R_2) C_1$.

If resistors and capacitors R1, R2, and C1 are not matched pairs then mismatch will cause a common-mode component to couple into the sampled data. In particular, the filter will let through high-frequency content if there is a mismatch in time constants seen at the + and − terminals of the amplifier, that would not be present if the time constants were matched. For this reason, the dominant pole in this circuit should be formed by R3 and C3.

Figure 11:
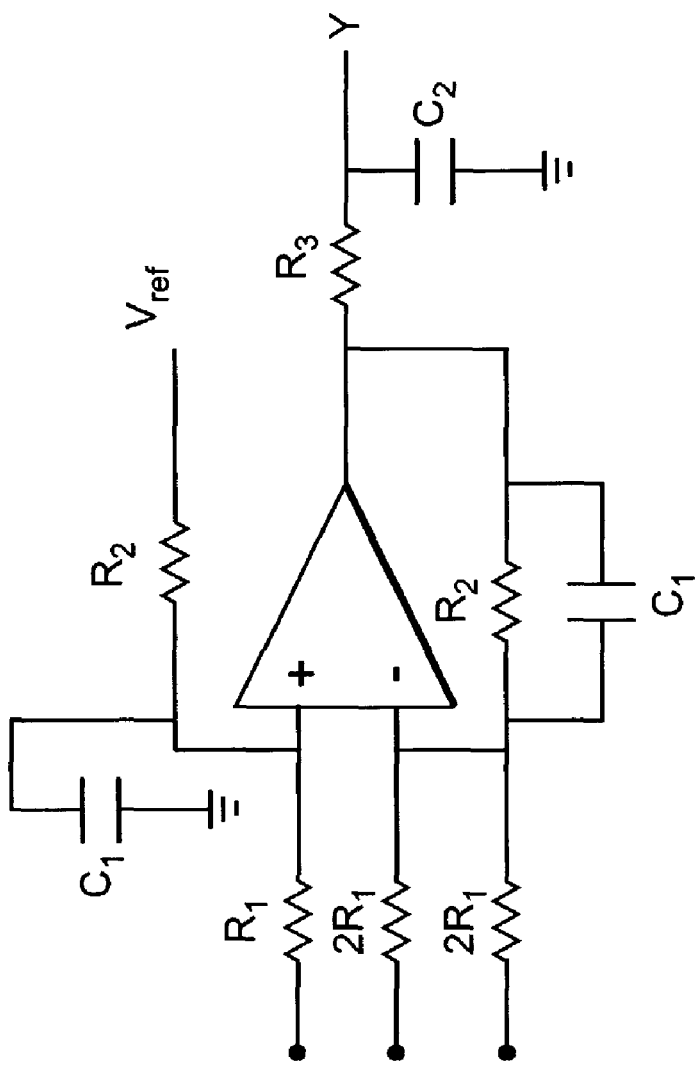
FIG. 11 is one embodiment in which there are multiple inputs.
Figure 11:
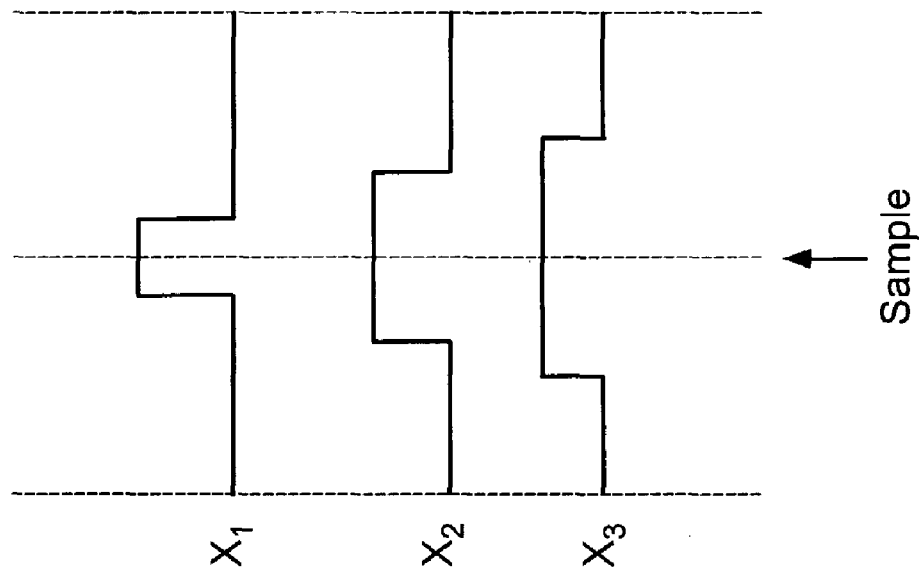
Figure 12:
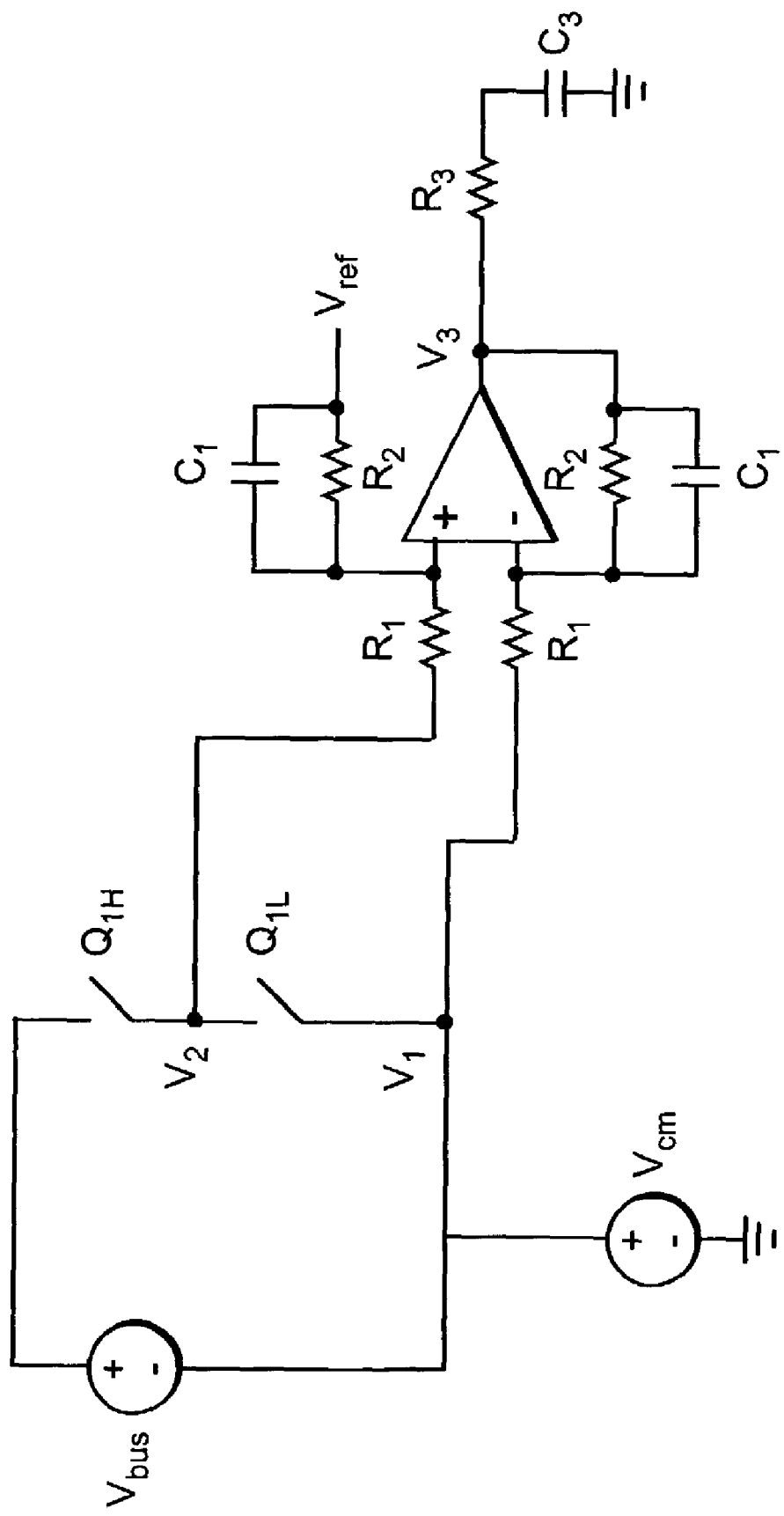
FIG. 12 is an embodiment of the differential version of the device for ground signals between power semiconductors and measurement circuitry.

In the differential embodiment, both PWM legs (leg for V1 and leg for V2) are preferably center-based PWM synchronous to the sampling point such that the sampling is done synchronous to the center of V1's PWM pulse and also to the center of V2's PWM pulse. This reduces the overall error. The error in the output as compared to a perfect measurement ($(D1-D_2)$Vbus where $D_1$ is the duty cycle of for leg one and $D_2$ is the duty cycle for leg two) is the difference between the errors that would result if each of V1 and V2 were synchronously sampled individually. The filter's time constant is selected such that the sampling time is close to the center of the PWM waveforms, as such, the errors in measuring V1 and V2 are small and therefore the error in Vout (which is the difference between the errors of V1 and V2) is also small. This circuit can be extended to any linear combination of signals. In such an embodiment, each signal would be a center-based PWM input that is sampled synchronously to the waveform center. The error due to sampling synchronously of the multiple inputs would be a linear combination of each signal's error. For example, if there were three inputs ($x_1, x_2, x_3$) as shown in FIG. 11, the voltage out would be equal to RC filter $(2x_1-x_2-x_3)K$, where K is equal to Rz/2Rt. The error in the output voltage should be a combination of the linear errors $e(x_1), e(x_2), e(x_3)$ where $E(y) = (2\,e(x_1) - e(x_2) - e(x_3))K$ The above differential circuit provided above can be implemented to handle ground differences between power semiconductors and measurement circuitry as shown in FIG. 12.

Synchronous sampling accomplished in an A/D converter can be implemented in other systems. For example, in a communications system in which there is a noisy channel, digital data may be transmitted to reject the noise rather than an analog signal. A PWM waveform may be used to represent an analog value in such a system and may be produced by a processor or micro-controller for example. By filtering and synchronous sampling of the PWM waveform, this methodology can be used to recapture the desired analog signal by filtering out the carrier frequency. The communications system may be a network for example, either wired or wireless or the system may be between two different circuits. In an embodiment in which the communications system is two different circuits the circuits may be at different potential and use a transformer or an opto-isolator to transmit. In such a system, it is more noise-immune to transmit in the digital domain and as such transmission of the analog signal values in a PWM format allows the voltage potential to be more readily changed. Again as before, the analog signal may be regained by filtering the PWM waveform which is created using the potential of the receiving circuit and synchronously sampling the PWM waveform at the carrier frequency. If the sending and receiving circuits are separate in a communications system, and the desired sampling instant is at top or bottom center of the PWM pulse, the knowledge of when to sample is not directly available to the receiving circuit and must be obtained somehow. In one embodiment the sending circuit should transmit an additional signal having a short synchronization pulse located at the center of each PWM pulse, so that the receiving circuit could use this signal to trigger the A/D converter. In another embodiment, the receiving circuit should have a phase-locked loop to reconvert A/D trigger pulses which are synchronized to the top or bottom center of the PWM waveform. If the desired sampling instant is at the rising and falling edges of the PWM pulse, the use of an edge detector, as explained above, to trigger the A/D converter is sufficient.

The method of filtering and synchronously sampling to remove the carrier frequency may be employed in configurations in which the originating signal is either an analog or digital signal. This can be seen in FIGS. 13A-C. FIG. 13A shows an analog waveform converted to a digital signal solely for the purpose of crossing an isolation barrier, whereupon the original waveform is restored using synchronous sampling. In FIG. 13B, data is created directly in a digital format 9 (e.g. a triangle wave generator) and sent across the isolation barrier and the synchronously sampled. In FIG. 13C, analog data is processed in digital format and then sent across the isolation barrier. In each case a PWM generator is used prior to transmission of the signal and a synchronous sampler is used at the receiver for removing the carrier frequency.

Although the invention has been described with reference to several preferred embodiments, it will be understood by one of ordinary skill in the art that various modifications can be made without departing from the spirit and the scope of the invention, as set forth in the claims below.

What is claimed is:

1. A device for filtering a carrier frequency of a PWM waveform, the PWM waveform having one or more pulses wherein each pulse is created at the carrier frequency, the device comprising:

a low-pass filter converting the PWM waveform into an analog signal;

a sampling analog to digital converter receiving the analog signal from the low-pass filter; and a controller causing the sampling analog to digital converter to sample the PWM waveform synchronously to the carrier frequency, thereby rejecting the carrier frequency;

wherein for each carrier frequency period there is a pulse leading edge, a pulse trailing edge, a pulse top and a pulse bottom, wherein the controller causes the sampling analog to digital converter to sample at the top of the pulse.

2. The device according to claim 1, wherein the controller causes the sampling analog to digital converter to sample at the bottom of the pulse and at the top of the pulse and wherein the samples from each pulse frequency period are averaged.

3. The device according to claim 1, wherein the controller causes the sampling analog to digital converter to sample at the leading edge of the pulse and at the trailing edge of the pulse and wherein the samples from each pulse frequency period are averaged.

4. The device according to claim 1, wherein the low pass filter is a first order filter.

5. The device according to claim 4, wherein the first order filter has one dominant pole.

6. The device according to claim 1, wherein the low pass filter has a minor second order pole.

7. The device according to claim 1, wherein the low pass filter is a filter having an order equal to or greater than two.

8. The device according to claim 1, wherein the PWM waveform is a single-ended PWM waveform.

9. The device according to claim 1, wherein the sampling analog-to-digital converter produces an output signal and the output signal used in a feedback control loop.

10. The device according to claim 1, wherein the device is used in a transportation device for controlling voltage to one or more motors.

11. The device according to claim 1, wherein the controller is the same controller that created the PWM waveform.

12. The device according to claim 1, wherein the controller does not initially have timing information for causing the sampling analog-to-digital converter to sample the analog signal;

wherein the device further comprises an edge detector for sensing one or more edges in the analog waveform and wherein the every two edges are averaged to obtain an output signal causing the sampling.

13. The device according to claim 1, wherein the controller causes the sampling analog to digital converter to sample at a center point of each pulse of the pulse-width modulated waveform.

14. The device according to claim 1, wherein the controller causes the analog to digital converter to sample at point after a center point of each pulse of the pulse-width modulated waveform.

15. The device according to claim 1, further comprising a compensation filter module that receives the output of the sampling digital-to-analog converter and outputs an analog signal that compensates for known error in the device.

16. The device according to claim 1, wherein the low-pass filter comprises a resistor and a capacitor.

17. The device according to claim 1, further comprising:
a load;
one or more switches where the PWM waveform controls the switches;
a voltage supply for supplying a voltage signal to the load when the one or more switches is closed; and wherein the voltage signal is provided to an input of the low pass filter.

18. The device according to claim 17, wherein the load is a motor.

19. The device according to claim 1, further comprising:
a plurality of loads;
a plurality of switches where the PWM waveform controls the switches;
a voltage supply which supplies a voltage signal to each of the loads when a respective switch is closed for the load; and wherein the each of the voltage signals is provided to the low pass filter.

20. The device according to claim 19, wherein each switch that corresponds with a load receives a different PWM waveform.

21. The device according to claim 19 wherein the low pass filter has a differential configuration.

22. A device for filtering a carrier frequency of a PWM waveform, the PWM waveform having one or more pulses wherein each pulse is created at the carrier frequency, the device comprising:
a low-pass filter converting the PWM waveform into an analog signal;
a sampling analog to digital converter receiving the analog signal from the low-pass filter; and
a controller causing the sampling analog to digital converter to sample the PWM waveform synchronously to the carrier frequency, thereby rejecting the carrier frequency;
wherein for each carrier frequency period there is a pulse leading edge, a pulse trailing edge, a pulse top and a pulse bottom, wherein the controller causes the sampling analog to digital converter to sample at the bottom of the pulse.

23. A device for filtering a carrier frequency of a PWM waveform, the PWM waveform having one or more pulses wherein each pulse is created at the carrier frequency, the device comprising:
a low-pass filter converting the PWM waveform into an analog signal;
a sampling analog to digital converter receiving the analog signal from the low-pass filter; and
a controller causing the sampling analog to digital converter to sample the PWM waveform synchronously to the carrier frequency, thereby rejecting the carrier frequency;
wherein the controller causes the sampling analog to digital converter to sample at a bottom point of the pulse-width modulated waveform pulse.

24. A device for filtering a carrier frequency of a PWM waveform, the PWM waveform having one or more pulses wherein each pulse is created at the carrier frequency, the device comprising:
a low-pass filter converting the PWM waveform into an analog signal;
a sampling analog to digital converter receiving the analog signal from the low-pass filter; and
a controller causing the sampling analog to digital converter to sample the PWM waveform synchronously to the carrier frequency, thereby rejecting the carrier frequency;
wherein the controller causes the non-integrating analog to digital converter to sample at a center point of the pulse-width modulated waveform pulse and at a bottom point of the pulse-width modulated waveform pulse; and
wherein the center point and the bottom point are averaged.

25. A method for sampling a voltage across a load, the method comprising:
   filtering in a low pass filter the voltage across a load creating an analog signal wherein the voltage across the load is created using a PWM signal having a carrier frequency; and
   sampling the analog signal synchronously to the carrier frequency;
   wherein the PWM signal has one or more pulses and wherein the sampling occurs at a top point of the pulse.

26. The method according to claim 25, wherein the low pass filter has one dominant pole.

27. The method according to claim 25, wherein the low pass filter is a resistor and a capacitor.

28. The method according to claim 25, wherein the pulse width modulated signal has one or more pulses and wherein the sampling occurs at least at twice the frequency used to create the pulse width modulated signal substantially at a center top point the pulse and substantially at a bottom point after the pulse and wherein the sampled points are averaged together to produce an output.

29. The method according to claim 25, further comprising:
   producing a pulse width modulated signal;
   providing the pulse width modulated signal to control at least one switch; wherein a voltage across the load is created when the at least one switch is switched on.

30. The method according to claim 29 further comprising: causing a motor to receive power.

31. The method according to claim 30, further comprising: converting the power into torque on a wheel which is part of a vehicle.

32. The method according to claim 31, wherein the wheel is part of a personal, self-balancing vehicle.

33. The method according to claim 25, further comprising: after the voltage signal across the load is sampled in an analog to digital converter, providing the sampled signal to a feedback control loop.

34. The method according to claim 25, further comprising: adjusting a duty cycle of the pulse width modulated signal as a result of the feedback control loop.

35. The method according to claim 25, wherein the pulse width modulated signal comprises one or more pulses and wherein in the step of sampling, the voltage signal is sampled at a temporal point which is later than a center location of the one or more pulses of the pulse width modulated signal.

36. A method according to claim 25, wherein the low pass filter is a differential low pass filter.

37. The method according to claim 25, further comprising: using an edge detector to obtain a leading edge of the pulse and a trailing edge of the pulse.

38. The method according to claim 37, wherein in the step of sampling, sampling occurs between the leading edge and the trailing edge of the pulse.

39. The method according to claim 37, wherein in the step of sampling, sampling occurs temporally halfway between the leading edge and the trailing edge of the pulse.

40. The method according to claim 25, further comprising: compensating for a known voltage error.

41. A method for sampling a voltage across a load, the method comprising:
   filtering in a low pass filter the voltage across a load creating an analog signal wherein the voltage across the load is created using a PWM signal having a carrier frequency; and
   sampling the analog signal synchronously to the carrier frequency;
   wherein the PWM signal has one or more pulses and wherein the sampling occurs substantially at a center top point of the pulse.

42. A method for sampling a voltage across a load, the method comprising:
   filtering in a low pass filter the voltage across a load creating an analog signal wherein the voltage across the load is created using a PWM signal having a carrier frequency; and
   sampling the analog signal synchronously to the carrier frequency;
   wherein the pulse width modulated signal has one or more pulses and wherein the sampling occurs substantially at a bottom point after the pulse.

43. A device for filtering a carrier frequency of a PWM waveform, the PWM waveform having one or more pulses wherein each pulse is created at the carrier frequency, the device comprising:
   a low-pass filter converting the PWM waveform into an analog signal;
   a sampling analog to digital converter receiving the analog signal from the low-pass filter; and
   a controller causing the sampling analog to digital converter to sample the PWM waveform synchronously to the carrier frequency, thereby rejecting the carrier frequency;
   wherein the PWM waveform has one or more consecutive pulse periods of duration $T=1/f_c$, where $f_c$ is the carrier frequency; and
   wherein the low-pass filter has a transfer function having a dominant pole with a time constant between $0.1T$ and $5T$.

* * * * *